(12) United States Patent
Evans

(10) Patent No.: US 6,864,569 B2
(45) Date of Patent: *Mar. 8, 2005

(54) STACKABLE MODULE

(75) Inventor: Paul Evans, Bristol (GB)

(73) Assignee: STMicroelectronics Limited, Bristol (GB)

( * ) Notice: Subject to any disclaimer, the term of this patent is extended or adjusted under 35 U.S.C. 154(b) by 0 days.

This patent is subject to a terminal disclaimer.

(21) Appl. No.: 10/714,760

(22) Filed: Nov. 17, 2003

(65) Prior Publication Data
US 2004/0105242 A1 Jun. 3, 2004

Related U.S. Application Data

(63) Continuation of application No. 10/085,121, filed on Feb. 27, 2002, now Pat. No. 6,731,514.

(30) Foreign Application Priority Data

Feb. 27, 2001 (EP) ............................................. 01301786

(51) Int. Cl.[7] ............................................. H01L 23/02
(52) U.S. Cl. ........................ 257/686; 257/686; 257/723
(58) Field of Search ................................. 257/686, 723, 257/724, 777, 778; 361/790, 796, 735; 710/100

(56) References Cited

U.S. PATENT DOCUMENTS

| | | | |
|---|---|---|---|
| 5,707,242 A | 1/1998 | Mitra et al. ................... 439/74 |
| 5,805,596 A | 9/1998 | Kranzler et al. ............. 370/445 |
| 5,847,985 A | 12/1998 | Mitani et al. .................. 365/63 |
| 5,963,464 A | 10/1999 | Dell et al. ..................... 365/52 |
| 6,049,467 A | 4/2000 | Tamarkin et al. ........... 361/790 |
| 6,101,089 A | 8/2000 | Seto et al. ................... 361/687 |
| 6,109,929 A * | 8/2000 | Jasper .......................... 439/74 |
| 6,431,879 B2 * | 8/2002 | Brekosky et al. ............. 439/74 |
| 6,476,476 B1 | 11/2002 | Glenn ......................... 257/686 |
| 6,477,593 B1 * | 11/2002 | Khosrowpour et al. ..... 710/100 |
| 6,552,914 B1 * | 4/2003 | Chang ......................... 361/796 |
| 6,731,514 B2 * | 5/2004 | Evans ......................... 361/790 |

FOREIGN PATENT DOCUMENTS

| | | |
|---|---|---|
| DE | 29 20 578 | 12/1980 |
| DE | 195 43 775 A1 | 5/1997 |
| DE | 298 12 581 U1 | 3/1999 |
| GB | 2 130 025 A | 5/1984 |
| JP | 20-76297 | 3/1990 |
| JP | 20000-31617 | 1/2000 |

* cited by examiner

Primary Examiner—David Nelms
Assistant Examiner—Thinh T Nguyen
(74) Attorney, Agent, or Firm—Lisa K. Jorgenson; E. Russell Tarleton; Seed IP Law Group PLLC

(57) ABSTRACT

A stackable module for a processor system including a support plate with a set of topside circuit components mounted to its topside, and topside and underside connectors. The module is stackable with other such modules and are provided with conductive tracks that are arranged to convey transport stream data and transport stream control signals between modules in a stack. A stack of such modules in a processor system is also provided.

28 Claims, 3 Drawing Sheets

STACKABLE MODULE

CROSS-REFERENCE TO RELATED APPLICATION

This application is a continuation of U.S. patent application Ser. No. 10/085,121, filed Feb. 27, 2002, now U.S. Pat. No. 6,731,514, which application is incorporated herein by reference in its entirety.

BACKGROUND OF THE INVENTION

1. Field of the Invention

The present invention relates to a stackable module and a stack of modules for a processor system.

2. Description of the Related Art

The invention is particularly but not exclusively concerned with providing modules as an expansion system to allow new peripherals to be added to set top box motherboards. The intention is to provide modules that provide an expansion capability in a flexible and multi-functional fashion.

Existing set top box motherboards comprise an onboard processor which can implement a certain amount of functionality relating to data supplied via the set top box. It is increasingly the case that set top boxes need to be able to function with a variety of different peripherals, such as expanded memory, audio and video peripherals. Moreover, decryption of data is increasingly becoming necessary.

Thus, it is necessary for the motherboard to provide a number of different interfaces to support different peripherals, and also for the onboard processor to be able to take into account the extra functionality. This can lead to a motherboard that is complex and cumbersome, often unnecessarily so when such peripherals are not needed.

One way to resolve this difficulty is to provide a motherboard to which can be attached one or more expansion modules.

BRIEF SUMMARY OF THE INVENTION

According to one aspect of the present invention there is provided a stackable module for a processor system, the module including: a support plate having a topside and an underside; a set of topside circuit components mounted on the topside of the support plate; a topside connector mounted to the topside of the support plate; an underside connector mounted to the underside of the support plate, wherein there are a first set of conductive tracks connected directly between the topside connector and the underside connector and a second set of conductive tracks connecting the topside connector to the topside circuit components, the underside connector and the topside connector being engageable with respective underside connectors and topside connectors of other modules, whereby the conductive tracks are arranged to convey transport stream data and transport stream control signals between modules in a stack.

The transport stream takes the form of digital, packetized, encoded data including audio and video data, for example in MPEG format. Information such as teletext, program guides, channel information, can also be provided. In addition, digital versions of analogue video and audio signals (not encoded) can be conveyed via the conductive tracks.

Another aspect of the invention provides a stack of modules in a processor system, the stack including: a main board having an interface connector and a set of main board components, the interface connector providing a set of pins for conveying transport stream data and transport stream control signals; at least one module comprising a support plate with an underside connector mounted to an underside of said support plate and a topside connector mounted to a topside of said support plate, the underside connector connected to the interface connector of the main board, wherein transport stream data and transport stream control signals are conveyed from at least some of said circuit components on the topside of the at least one module to the interface connector of the main board.

In a stack, the topside connector of a current module forms an UP port with the underside connector of the module above it. The underside connector of the current module forms a DOWN port with the topside connector of the module below it for the current module.

The topside and underside connectors can each comprise a set of pins for carrying memory access signals to allow a module to function as an external memory interface (EMI).

In the described embodiment the topside connector is a receptacle and the underside connector is a plug, but it will readily be appreciated that the reverse configuration is possible.

Each support plate can comprise at least one through-hole for receiving a support pillar. In such an arrangement, a support pillar can be provided on a support plate at a location so as to pass through a through-hole of an upper module in a module stack.

Each module can comprise a connector space-defining component which extends upwardly from the support plate by a distance calculated to define the minimum spacing between modules in a stack.

Modules of different types can be provided, and such modules can be stackable in a common stack.

According to one type, the circuit components of the module constitute a transport stream generating device that generates transport stream data and transport stream control signals. Examples are a tuner board or packet injector converter.

A second type of module has circuit components that constitute a device, which acts on transport stream data and transport stream control signals, for example a decryptor.

A third type of module has circuit components that constitute a device which does not utilize transport stream data and transport stream control signals, for example an EMI. In that case, the transport stream data and control signals are supplied via said topside and underside connectors directly to another module in the module stack.

A module can include a multiplexor for selectively selecting transport stream data from a lower module in the stack and an upper module in the stack (i.e., from the UP or DOWN port).

The stackable modules described herein provide expansion capabilities to set top box motherboards or main boards. In particular, transport streams are supported. The described embodiment supports memory access peripherals in addition to transport streams.

The modules can be stacked on top of each other to minimize main board requirements. The modules provide cableless expansion of general set top box peripherals.

Although the main application for the modules is considered to be for a set top box motherboard, they may be used in other applications.

The invention will now be described, by way of example only, with reference to the accompanying drawings.

DETAILED DESCRIPTION OF THE INVENTION

Figure 1:
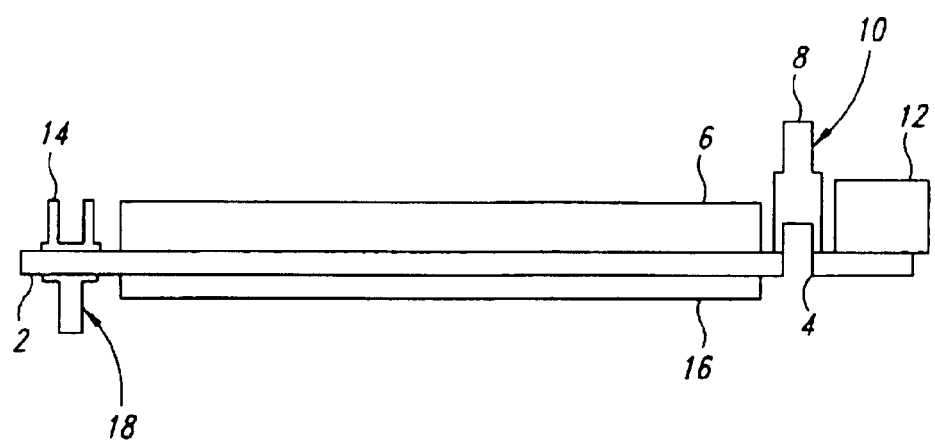
FIG. 1 shows in side view a single module.
Figure 2:
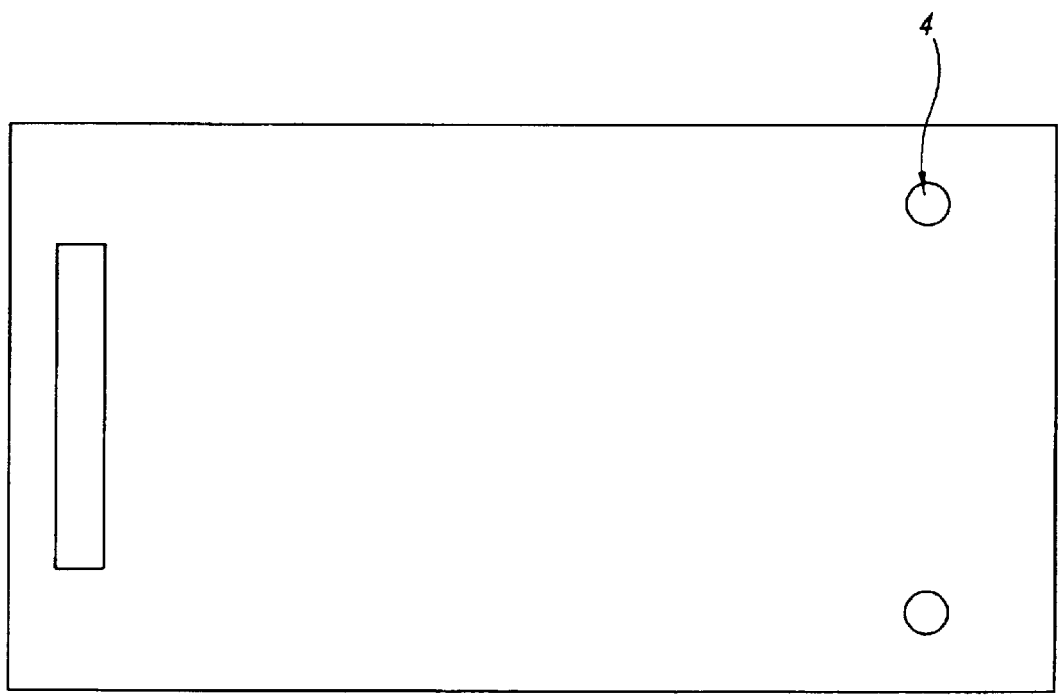
FIG. 2 illustrates a plan view of a module in the modular system of FIG. 1.

FIG. 1 illustrates a single module. The module comprises a support plate 2 (for example in the form of a printed circuit board) which, as can be seen in plan view in FIG. 2, is rectangular in shape and essentially planar. Two through-holes 4 are formed in the plate. The plate 2 carries on its upper surface or topside a set of electrical components labeled 6 in FIG. 1. The topside of the plate 2 also carries a support pillar 8, which is an essentially cylindrical pillar having two diameters interfacing to form a stepped portion 10, the purpose of which will be discussed later. A connector space clearance component 12 is also provided on the topside of the plate.

The topside of the plate 2 has mounted to it a pass-through connector 14 in the form of a receptacle with pins (not shown) in its center. Although not shown in FIG. 1, all tracks extending from the components attached to the module on the topside are connected to pins in the pass through connector 14.

The underside of the plate 2 carries further sets of components labeled 16 in FIG. 1. An interface connector 18 in the form of a plug is used to guide all tracks from the underside components 16, via pins in the connector 8. In addition a set of conductive tracks connect at least some of the pins in the topside connector 14 to the underside connector directly, rather than via the circuit components. The topside and underside connectors are surface mounted, and the conductive tracks directly connecting them extend through the plate.

Thus, each connector provides two sets of conductive tracks. A first set connects two pins in the receptacle pass-through connector and passes directly through the plate 2 to the underside connector. The second set of conductive tracks passes from the pins in the topside connector to the circuit components on the topside of the plate. A further set of conductive tracks can similarly be provided on the underside of the plate to connect the underside components to the interface connector 18 in the form of a plug. As described more fully in the following, the provision of these two sets of conductive tracks allow for the possibility of signals to go directly through a module (without interacting with the circuit components on it), or to be directly from or to the circuit components on the module. The manner in which this can be utilized is discussed in more detail in the following.

The connector space clearance component 12 extends to a height above the topside components 6 to ensure that proper clearance is provided for components of different types. The connector space clearance component 12 ensures that there is adequate clearance between stacked modules in a modular system as will be seen in the following.

Figure 3:
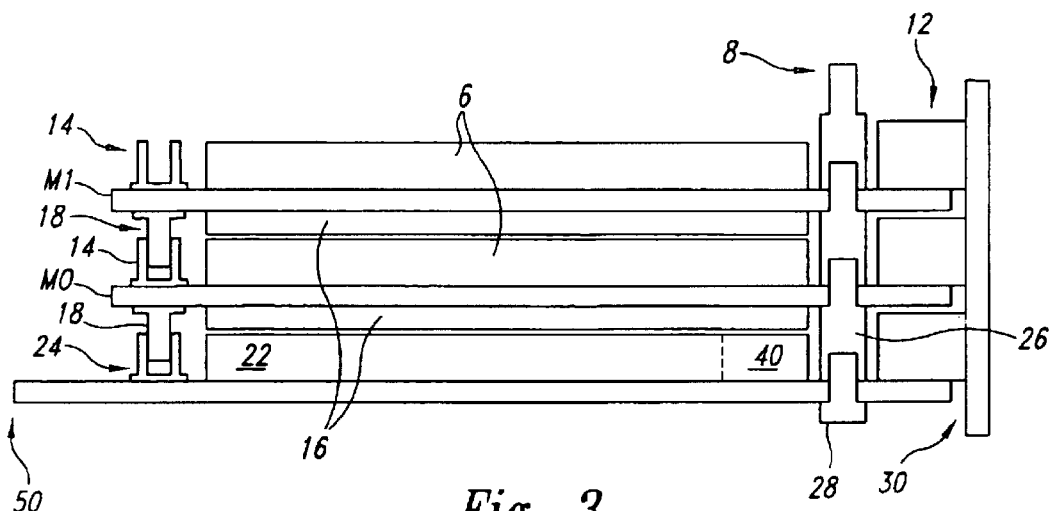
FIG. 3 illustrates a side view of a modular system.

FIG. 3 illustrates a modular system comprising a main board 50 and a plurality of modules M0, M1. Although only two modules are shown in FIG. 3, it will be apparent that any number of modules may be provided.

The main board 50 in the described embodiment comprises a printed circuit board for a set top box. It carries a plurality of main board components 22 including the main processor 40, and a main board interface connector 24 mounted to its topside. The main board interface connector 24 is of the same type as the pass through connector 14 on each module. The main board 50 also carries a support pillar 26 and has two through holes 28. Reference numeral 30 denotes a system case panel which abuts the connector space clearance component 12. As can readily be seen in FIG. 3, the interface connector 18 on the underside of a module engages the pass through connector 14 on the topside of the lower module. A support pillar 8 of the lower module extends through each of the through holes 4 of the module above it and engages with its stepped portion 10 the underside of the support pillar 8 of the upper module to form a continuous support arrangement.

An important function of the module is to allow for the communication of transport stream data and control signals between the module and the motherboard. The transport stream data comprises digital encoded and packetized data conveying audio, video and other information for example according to the MPEG standard. The transport stream control signals are the signals required to control the flow of transport stream data, for example clocking, and are discussed in more detail hereinafter.

Figure 4:
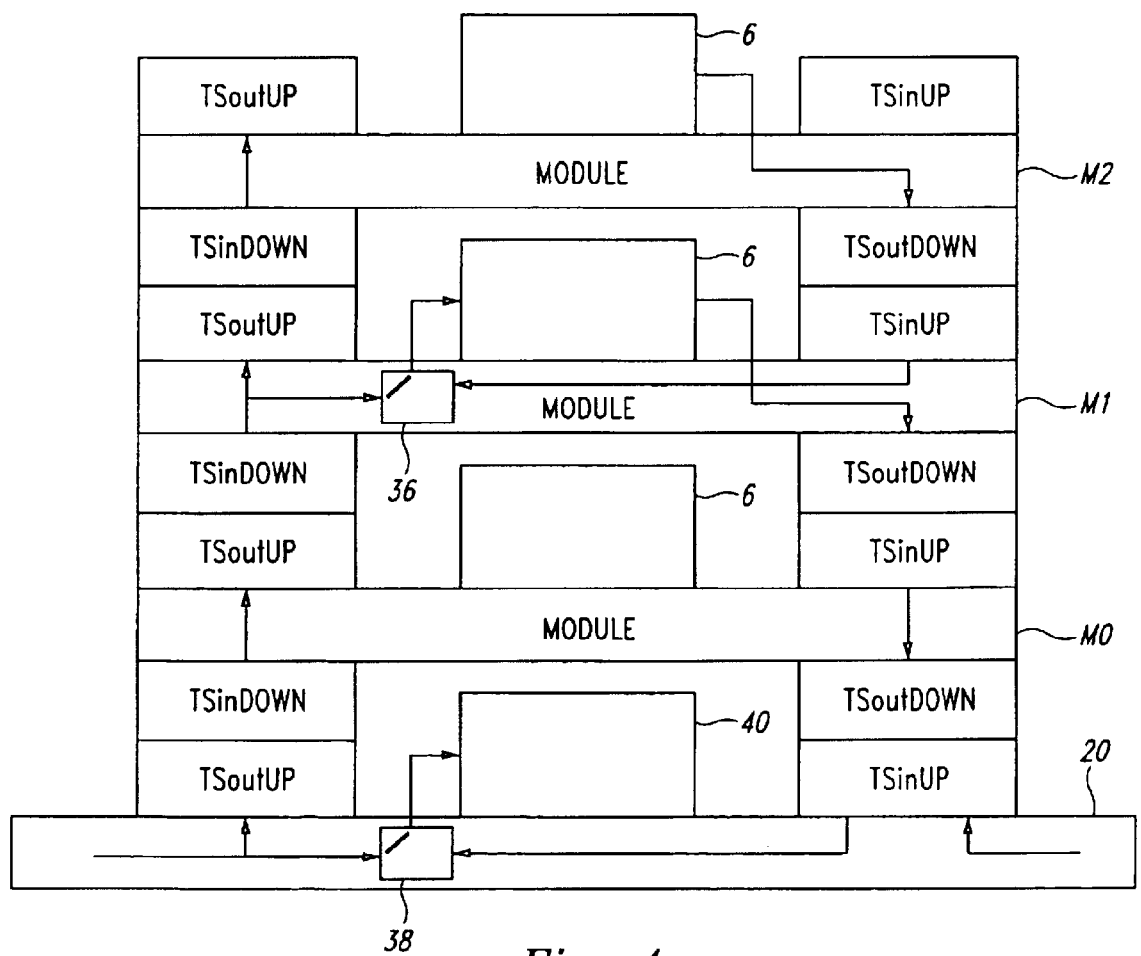
FIG. 4 is a schematic diagram illustrating the transport streams in the modular system.

Reference will now be made to FIG. 4 to explain the transport stream through the modular system. The modular system of FIG. 4 has three stacked modules M0, M1 and M2 on the main board 50. In the following, a DOWN port provides the connection between a lower module in the stack and the current module. An UP port provides the connection to the module above the current module. An input transport stream TSin refers to signals sourced from a different board or module and "input" into the current module. An output transport stream TSout refers to signals generated by the current module and passed to another module for another board. This terminology is used in the arrangement illustrated in FIG. 4 to diagrammatically illustrate the transport stream flow. It will be appreciated that in the physical form of the module as illustrated in FIGS. 1 and 3, each engaged pair of interface connectors 14, 18 constitutes both a DOWN port and an UP port, capable of carrying the input transport stream TSin and the output stream TSout. In FIG. 4 these have been separated for clarity and are referred to as:

TsoutUP—the output transport stream from the current module to the module above it TSinUP—the input transport stream to the module below the current module TSinDOWN—the input transport stream to the current module from the module above it TSoutDOWN—the output module stream from the current module to the module below it.

Figure 5:
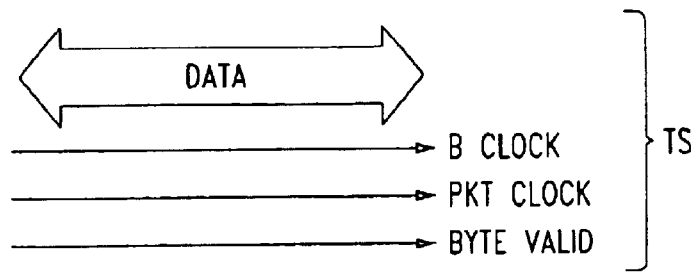
FIG. 5 shows the signals of the transport stream.

The transport stream is shown in FIG. 5. It comprises a set of parallel signals including eight bits of data, a byte clock BClock, and packet clock PktClock and a Byte_Valid signal. The ability of the module to convey a transport stream of this type allows the modules to have additional functionality beyond merely interfacing to memory mapped peripherals. Thus, modules can provide circuitry and devices which actively create transport streams, i.e., tuners or packet generators, and/or process transport streams, for example decryptors. Modules also allow interface to memory mapped peripherals as discussed in more detail in the following, which can be provided on the motherboard.

FIG. 4 illustrates three different types of the way in which modules can use the transport stream. Each module M0,M1, M2 carries circuitry 6 that provides a [peripheral] device which determines the functionality of the module. A module can generate a transport stream, process a transport stream or pass on a transport stream. We will follow the input transport stream moving up the stack TSinDOWN. The first module, M0, does not use the input transport stream TSin-DOWN which is supplied from a peripheral on a motherboard so it is conveyed via the interface connector 24 on the main board 50 and the pass through connector 14 of the module M0 (which constitutes its DOWN port) to its UP port via the set of conductive tracks that connect directly through the connectors 18,14. The transport stream is thus conveyed to the module M1 which does use the transport stream and includes a multiplexor 36 which allows it to select whether it uses that input transport stream TSin-DOWN from the module M0 or the input transport stream TSinUP supplied to it via its UP port from the third module M2. The multiplexor 36 is connected to the port TSoutUP via a conductive track connected to the pins of the connector at that port. It is connected to the port TSinUP via a further conductive track connected to the pins of the connector at that port.

The device 6 on the module M2 does not utilize the input transport stream TSinDOWN but creates its own transport stream TSout which it supplies via its DOWN port so that it can be supplied to the module M1 and used by that module, depending on the setting of the multiplexor 36 at the module M1. As an example, the component device of module M2 could be a tuner board or packet injector converter. An example of a device for module M1 could be a decryptor that acts on the input transport stream TSin supplied from its DOWN port, or on the input transport stream TSinUP supplied from its UP port depending on the setting of the multiplexor 36. The processed output stream from the device 6 on the module M1 constitutes the output transport stream TSoutDOWN for that module.

It will be appreciated that the main board 20 should preferably support both a transport stream generated by circuitry on the main board for supply to a module and a transport stream generated by a module for supply to the main board. These are labeled TSoutUP and TSinUP on the ports attached to the main board 20 in FIG. 4. The main board has a multiplexor 38 that selects whether the microprocessor uses the onboard input transport stream or the output stream TSout from the module stack. This allows the use of the main board with no module present or to bypass the modules for software testing purposes.

Each of the interface connectors 14, 18 has a set of pins described more fully in the following. In particular, they include two presence detect pins (labeled 42, 44 in FIG. 6). The pins are named MEZZ_PRESENT (1:0) for each port. They are pulled up to 3.3V on the main board 20 and can be read by the processor 40 on the main board. Each module should tie the presence detect pin DOWN_MEZZ_PRESENT0 to ground and should connect the presence detect pin UP_MEZZ_PRESENT0 to the presence detect pin DOWN_MEZZ_PRESENT1. The processor 40 on the main board can then read the two presence detect bits (which are effectively UP_MEZZ_PRESENT0 and UP_MEZZ_PRESENT1, that is the presence detect bits associated with the main board interface connector 24) to determine whether or not one or more modules is present according to the logic given in Table 1.

TABLE 1

MEZZ_PRESENT VALUES

| MP1 | MP0 | Description |
| --- | --- | --- |
| 1 | 1 | No modules present |
| 1 | 0 | Module 0 present only |
| 0 | 0 | Module 0 and 1 present (or more) |
| 0 | 1 | Illegal |

Figure 6:
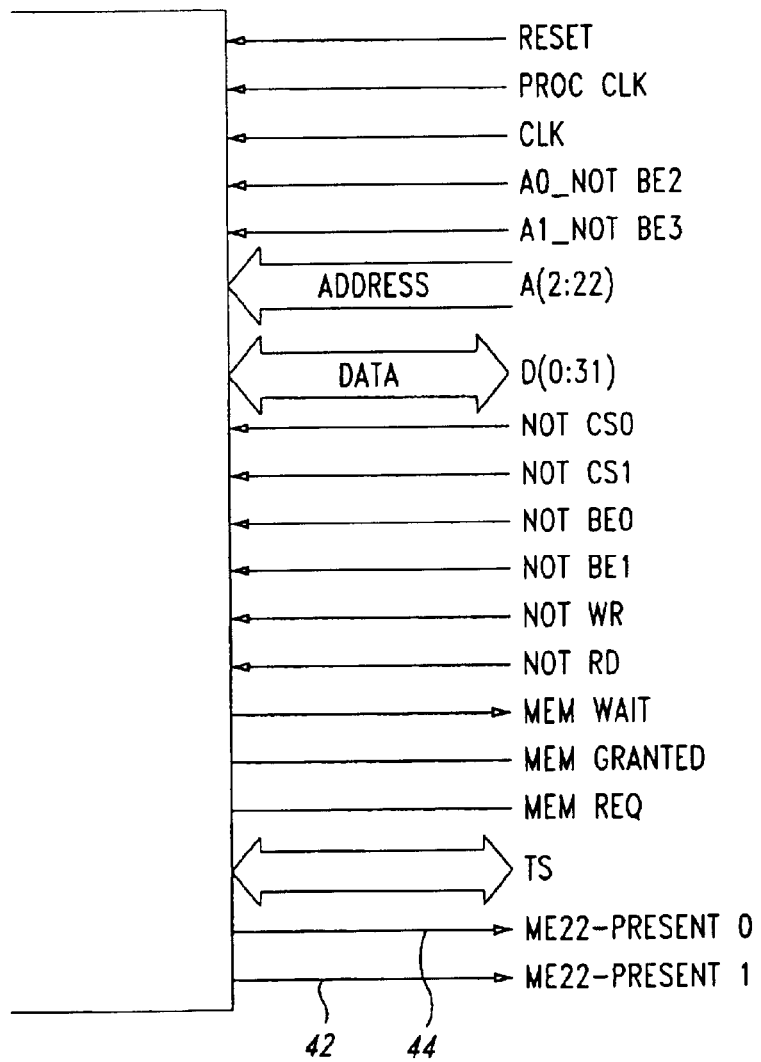
FIG. 6 shows the main signals of an interface connector.

FIG. 6 illustrates the pin out of the connectors 14,18. The pin out for the underside connector 18 is illustrated, although it will be appreciated that the pin out for the receiving (topside) connector 14 is similar, but with different direction for the signals. The meaning of the signals illustrated in FIG. 6 is given below in Table 2.

TABLE 2

| Pin Num | Type | Name | Description |
| --- | --- | --- | --- |
| | | System Signals | |
| 31 | Input | RESET | Active high module reset. |
| 70 | Input | ProcCLOCK | Processor clock signal |
| 140 | Input | 27 MHz_CLK | 27 MHz signal from system VCXO |
| | | EMI Signals | |
| 119 | Input | A0_notBE2 | Least significant byte address bit A0 in 8 or 16 bit databus mode. Active low Byte Enable for Data(23:16) in 32 bit databus mode. |
| 49 | Input | A1_notBE3 | Address bit A1 in 8 bit databus mode. Active low Byte Enable for Data(31:24) in 16 or 32 bit databus mode. |
| 118 | Input | A2 | Address bit |
| 48 | Input | A3 | Address bit |
| 117 | Input | A4 | Address bit |
| 47 | Input | A5 | Address bit |
| 116 | Input | A6 | Address bit |
| 46 | Input | A7 | Address bit |
| 115 | Input | A8 | Address bit |
| 45 | Input | A9 | Address bit |
| 114 | Input | A10 | Address bit |
| 44 | Input | A11 | Address bit |
| 112 | Input | A12 | Address bit |
| 42 | Input | A13 | Address bit |
| 111 | Input | A14 | Address bit |
| 41 | Input | A15 | Address bit |
| 110 | Input | A16 | Address bit |
| 40 | Input | A17 | Address bit |
| 109 | Input | A18 | Address bit |
| 39 | Input | A19 | Address bit |
| 108 | Input | A20 | Address bit |
| 38 | Input | A21 | Address bit |
| 107 | Input | A22 | Address bit |
| 37 | Input | A23 | Most significant byte address bit. |
| 138 | I/O | Data0 | Least significant data bit. |
| 68 | I/O | Data1 | Data bit |
| 137 | I/O | Data2 | Data bit |
| 67 | I/O | Data3 | Data bit |
| 136 | I/O | Data4 | Data bit |
| 66 | I/O | Data5 | Data bit |
| 135 | I/O | Data6 | Data bit |
| 65 | I/O | Data7 | Data bit |
| 134 | I/O | Data8 | Data bit |
| 64 | I/O | Data9 | Data bit |
| 133 | I/O | Data10 | Data bit |
| 63 | I/O | Data11 | Data bit |

TABLE 2-continued

| Pin Num | Type | Name | Description |
|---|---|---|---|
| 132 | I/O | Data12 | Data bit |
| 62 | I/O | Data13 | Data bit |
| 131 | I/O | Data14 | Data bit |
| 61 | I/O | Data15 | Data bit |
| 129 | I/O | Data16 | Data bit |
| 59 | I/O | Data17 | Data bit |
| 128 | I/O | Data18 | Data bit |
| 58 | I/O | Data19 | Data bit |
| 127 | I/O | Data20 | Data bit |
| 57 | I/O | Data21 | Data bit |
| 126 | I/O | Data22 | Data bit |
| 56 | I/O | Data23 | Data bit |
| 125 | I/O | Data24 | Data bit |
| 55 | I/O | Data25 | Data bit |
| 124 | I/O | Data26 | Data bit |
| 54 | I/O | Data27 | Data bit |
| 123 | I/O | Data28 | Data bit |
| 53 | I/O | Data29 | Data bit |
| 122 | I/O | Data30 | Data bit |
| 52 | I/O | Data31 | Most significant data bit |
| 105 | Input | NotCS0 | Module chip select. Active Low. |
| 35 | Input | NotCS1 | Module chip select. Active Low. |
| 120 | Input | NotBE0 | Least significant byte enable Data(7:0) |
| 50 | Input | NotBE1 | Byte Enable Data(15:8) |
| 34 | Input | notWR | Active low Write strobe. |
| 104 | Input | NotOE | Active low Read strobe. |
| 102 | Output | MemWait | Active high access wait strobe. Used to stretch memory accesses to module. Pulled low on main board by 10K resistor. |
| 100 | Input | MemGranted | Active high |
| 101 | Output | MemReq | Active high |
| *Transport pins* | | | |
| 9 | Input | TS_IN_DATA0 | |
| 8 | Input | TS_IN_DATA1 | |
| 7 | Input | TS_IN_DATA2 | |
| 6 | Input | TS_IN_DATA3 | |
| 5 | Input | TS_IN_DATA4 | |
| 4 | Input | TS_IN_DATA5 | |
| 3 | Input | TS_IN_DATA6 | |
| 2 | Input | TS_IN_DATA7 | Transport stream Data 7 or serial data. |
| 11 | Input | TS_IN_CLK | |
| 13 | Input | TS_IN_DVAL | |
| 12 | Input | TS_IN_DSTRT | |
| 79 | Output | TS_OUT_DATA0 | |
| 78 | Output | TS_OUT_DATA1 | |
| 77 | Output | TS_OUT_DATA2 | |
| 76 | Output | TS_OUT_DATA3 | |
| 75 | Output | TS_OUT_DATA4 | |
| 74 | Output | TS_OUT_DATA5 | |
| 73 | Output | TS_OUT_DATA6 | |
| 72 | Output | TS_OUT_DATA7 | |
| 81 | Output | TS_OUT_CLOCK | |
| 83 | Output | TS_OUT_DVAL | |
| 82 | Output | TS_OUT_DSTRT | |
| *1394 LLI Interface* | | | |
| 88 | I/O | AVData0 | |
| 18 | I/O | AVData1 | |
| 87 | I/O | AVData2 | |
| 17 | I/O | AVData3 | |
| 86 | I/O | AVData4 | |
| 16 | I/O | AVData5 | |
| 85 | I/O | AVData6 | |
| 15 | I/O | AVData7 | |
| | I/O | AVPacketTag0 | |
| | I/O | AVPacketTag1 | |
| | I/O | AVPacketTag2 | |
| | I/O | AVPacketTag3 | |
| 91 | I/O | AVByteClk | |
| 21 | I/O | AVByteClkValid | |
| 19 | I/O | AVPacketErr | |
| 89 | I/O | AVPacketReq | |
| 20 | I/O | AVFrameSync | |
| 90 | I/O | AVPacketClk | |
| *Miscellaneous Signals* | | | |
| 23 | Input | 12C_SCL | 12C Clock signal |
| 93 | I/O | 12C_SDA | 12C Data signal |
| 32 | Open drain Output | notINTR | Active low Wired-OR interrupt. Pulled high by 10K pullup on main board. |
| 99 | Output | MEZZ_PRESENT0 | |
| 30 | Output | MEZZ_PRESENT1 | |
| 24 | I/O | Spare1 | |
| 25 | I/O | Spare2 | |
| 94 | I/O | Spare3 | |
| 95 | I/O | Spare4 | |
| *Power pins* | | | |
| 14, 29, 84, 98 | Supply | +5 V | Positive power supply. 5 V + −5% @ 2A. |
| 43, 60, 113, 130 | Supply | +3 V 3 | Positive power supply. 3.3 V + −5% @ 2A. |
| 1, 71 | Supply | +12 V | Positive power supply. 12 V + −10% @ 1A. |
| 10, 22, 33, 36, 51, 69, 80, 92, 103, 106, 121, 139 | Supply | GROUND | |

As already mentioned, modules can act as memory mapped peripherals. To that end, the interface provides address and data signals, and memory access control signals notWR, notRD, MemWait, MemGranted and MemReq. These signals allow the microprocessor 40 on the main board to access memory mapped peripherals. In the described embodiment, two active load chip selects notCS0, notCS1 are provided to support up to two memory mapped expansion modules. The functions of these signals are described below.

The DATA signals constitute a buffered bidirectional 32 bit data bus which supports 3.3V signals.

The active load chip selects notCS(1:0) have already been mentioned. Each module is configurable to select which chip select it will use.

The address lines ADDRESS act as word addresses.

The signals labeled notBE0:3 are active-low byte-enable strobes. The signal notBE3 is also used as address signal line A1 when in 8/16 bit bus mode. The signal notBE2 is also used as a zero when in 8 bit bus mode.

The active low write strobe signal notWR is active for the duration of a write cycle.

The active low read strobe signal notRD is active for the duration of a read cycle.

The signal MemWait is an active-high access-wait signal. This signal is sampled during each cycle of the memory access. When high, the cycle state is paused and continues once the MemWait signal goes low again. It can be used to enable slower devices to be accessed in the same bank as faster signals.

The RESET signal is an active-high reset signal that follows initial board power on reset. After power up, the module reset should preferably be software controllable by the onboard processor 40 to allow reset of the modules at any time.

The clock signal CLK is the system clock, which is buffered and supplied to the module interface. The processor clock PROCCLK is output from the processor to allow bus synchronization.

The LLI interface is a bi-directional secondary transport stream interface.

It is possible for the modules to incorporate devices based on a so-called I2C protocol (a two-wire control bus). In that case the main board tuner I2C interface could be included to configure such I2C-based devices on the modules. The I2C bus should in that case be buffered on the main board before going to the module interface. Any I2C-based device on the modules should have a fully selectable address to ensure that an address is possible that will not conflict with other devices on the bus. The address select options can be selectable by a suitable switch block.

While the above discussion has focused on the provision of transport stream data and its corresponding control signals, it will be appreciated that the modules can also carry other types of data, in particular unencoded video and/or audio data in digital format.

From the foregoing it will be appreciated that, although specific embodiments of the invention have been described herein for purposes of illustration, various modifications may be made without deviating from the spirit and scope of the invention. Accordingly, the invention is not limited except as by the appended claims and the equivalents thereof.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A stackable module for a processor system, the module comprising:
   a support plate having a topside and an underside;
   a set of topside circuit components mounted on the topside of the support plate, the circuit components constituting a transport stream generating device that generates transport stream data and transport stream control signals;
   a topside connector mounted to the topside of the support plate;
   an underside connector mounted to the underside of the support plate directly under and corresponding to the topside connector; and
   a first set of conductive tracks connected directly between the topside connector and the corresponding underside connector and a second set of conductive tracks connecting the topside connector to the set of topside circuit components, the topside connector and the corresponding underside connector engageable with respective underside connectors and topside connectors of other modules, the first and second set of conductive tracks arranged to convey the transport stream data and the transport stream control signals in a stack of modules.

2. The stackable module of claim 1 wherein each of the topside and underside connectors comprises a set of pins for carrying memory access signals to enable the module to function as an external memory interface.

3. The stackable module of claim 1 wherein the topside connector is a receptacle and the underside connector is a plug.

4. The stackable module of claim 1 wherein the support plate comprises at least one through-hole for receiving a support pillar.

5. The stackable module of claim 4 wherein the support pillar is provided on the support plate at a location so as to pass through a through-hole of an upper module in a stack of modules.

6. The stackable module of claim 1, comprising a connector space defining a component that extends from the support plate by a distance calculated to define the minimum spacing in the stack of modules.

7. The stackable module of claim 1 wherein said circuit components further comprise a device that acts on the transport stream data and the transport stream control signals.

8. The stackable module of claim 7, comprising a multiplexor for selectively selecting the transport stream data from a lower module in the stack and an upper module in the stack for acting on by said device.

9. The stackable module of claim 1 wherein the circuit component further comprises a device that does not utilize the transport stream data and the transport stream control signals, said transport stream data and control signals supplied via said topside and underside connectors directly to another module in a stack of modules.

10. A stack of modules in a processor system, said stack comprising:
    a main board having an interface connector and a set of main board components, the interface connector providing a set or pins for conveying transport stream data and transport stream control signals;
    at least one module comprising:
    a support plate having a topside and an underside;
    a set of topside circuit components mounted on the topside of the support plate and comprising a transport stream generating device configured to generate the transport stream data and the transport stream control signals;
    a topside connector mounted to the topside of the support plate;
    an underside connector corresponding to the topside connector, the underside connector mounted to the underside of the support plate and connected to the interface connector of the main board; and
    a first set of conductive tracks connected directly between the topside connector and the underside connector and a second set of conductive trucks connecting the topside connector to the topside circuit components, the topside connector and the corresponding underside connector engaged with respective underside connectors and topside connectors of other modules in the stack, the first and second set of conductive tracks arranged to convey the transport stream data and the transport stream control signals in the stack of modules.

11. The stack of modules of claim 10 wherein the support plate of said at least one module comprises the topside having a set or topside circuit components.

12. The stackable module of claim 11 wherein said circuit components comprise a device that acts on the transport stream data and the transport stream control signals.

13. The stack of modules of claim 11 wherein said at least one module comprises a multiplexer for selectively selecting the transport stream data from a lower module in the stack and an upper module in the stack for acting on by said device.

14. The stack of modules of claim 11 wherein the circuit components comprise a device that does not utilize the transport stream data and the transport stream control signals, said transport stream data and control signals being supplied via said topside and underside connectors directly to another module in the stack of modules.

15. A stackable module for a processor system, the module comprising:
  a support plate having a topside and an underside;
  a set of topside circuit components mounted on the topside of the support plate, said circuit components constitute a device which acts on transport stream data and transport stream control signals;
  a topside connector mounted to the topside of the support plate;
  an underside connector corresponding to the topside connector, the underside connector mounted to the underside of the support plate;
  a first set of conductive tracks connected directly between the topside connector and the corresponding underside connector and a second set of conductive tracks connecting the topside connector to the topside circuit components, the topside connector and the corresponding underside connector engageable with respective underside connectors and topside connectors of other modules, the conductive tracks arranged to convey the transport stream data and the transport stream control signals in a stack of modules; and
  a multiplexor for selectively selecting the transport stream data from a lower module in the stack and an upper module in the stack for acting on by said device.

16. A stackable module for a processor system, the module comprising:
  a support plate having a topside and an underside;
  a set of topside circuit components mounted on the topside of the support plate;
  a topside connector mounted to the topside of the support plate;
  an underside connector corresponding to the topside connector, the underside connector mounted to the underside of the support plate; and
  a first set of conductive tracks connected directly between the topside connector and the underside connector and a second set of conductive tracks connecting the topside connector to the topside circuit components, the underside connector and the topside connector being engageable with respective underside connectors and topside connectors of other modules, the conductive tracks arranged to convey transport stream data and transport stream control signals between modules in a stack of modules; and
  wherein the circuit components constitute a device that does not utilize the transport stream data and the transport stream control signals, all of the transport stream data and the transport stream control signals being supplied via said topside and underside connectors directly to another module in the stack of modules.

17. A stackable module for a processor system, the module comprising:
  a support plate having a topside, an underside, and at least one through-hole for receiving a support pillar;
  a set of topside circuit components mounted on the topside of the support plate;
  a topside connector mounted to the topside of the support plate;
  an underside connector corresponding to the topside connector and mounted to the underside of the support plate; and
  a first set of conductive tracks connected directly between the topside connector and the corresponding underside connector and a second set of conductive tracks connecting the topside connector to the set of topside circuit components, the topside connector and the underside connector being engageable with respective underside connectors and topside connectors of other modules, the first and second set of conductive tracks arranged to convey the transport stream data and the transport stream control signals in a stack of modules, each of the topside and underside connectors comprises a set of pins for carrying memory access signals to enable the module to function as an external memory interface.

18. The stackable module of claim 17 wherein the topside connector is a receptacle and the underside connector is a plug.

19. The stackable module of claim 18 wherein the support pillar is provided on the support plate at a location so as to pass through a through-hole of an upper module in a stack of modules.

20. The stackable module of claim 17, comprising a connector space defining a component that extends from the support plate by a distance calculated to define the minimum spacing in a stack of modules.

21. The stackable module of claim 17 wherein the circuit components constitute a transport stream generating device that generates the transport stream data and the transport stream control signals.

22. The stackable module of claim 17 wherein said circuit components constitute a device that acts on the transport stream data and the transport stream control signals.

23. The stackable module of claim 22, comprising a multiplexor for selectively selecting the transport stream data from a lower module in the stack and an upper module in the stack for acting on by said device.

24. The stackable module of claim 17 wherein the circuit component comprises a device that does not utilize the transport stream data and the transport stream control signals, said transport stream data and control signals being supplied via said topside and underside connectors directly to another module in a stack of modules.

25. A stack of modules in a processor system, said stack comprising:
  a main board having an interface connector and a set of main board components, the interface connector providing a set of pins for conveying transport stream data and transport stream control signals;
  at least one module comprising:
    a support plate having a topside and an underside;
    a set of topside circuit components mounted on the topside of the support plate and comprising a transport stream generating device configured to generate the transport stream data and the transport stream control signals;
    a topside connector mounted to the topside of the support plate;
    an underside connector mounted to the underside of the support plate and connected to the interface connector of the main board;

a first set of conductive tracks connected directly between the topside connector and the underside connector and a second set of conductive tracks connecting the topside connector to the topside circuit components, the underside connector and the topside connector being engaged with respective underside connectors and topside connectors of other modules in the stack, the first and second set of conductive tracks arranged to convey the transport stream data and the transport stream control signals in the stack of modules; and a multiplexer for selectively selecting the transport stream data from a lower module in the stack and an upper module in the stack for acting on by said device.

26. A stack of modules in a processor system, said stack comprising:

a main board having an interface connector and a set of main board components, the interface connector providing a set of pins for conveying transport stream data and transport stream control signals;

at least one module comprising:
a support plate having a topside and an underside;
a set of topside circuit components mounted on the topside of the support plate;
a topside connector mounted to the topside of the support plate;
an underside connector mounted to the underside of the support plate and connected to the interface connector of the main board; and
a first set of conductive tracks connected directly between the topside connector and the underside connector and a second set of conductive tracks connecting the topside connector to the topside circuit components, the underside connector and the topside connector being engaged with respective underside connectors and topside connectors of other modules in the stack, the first and second set of conductive tracks arranged to convey the transport stream data and the transport stream control signals in the stack of modules; and
wherein the circuit components constitute a device that does not utilize the transport stream data and the transport stream control signals, all of the transport stream data and the transport stream control signals being supplied via said topside and underside connectors directly to another module in the stack of modules.

27. A stackable module for a processor system, the module comprising:

a support plate having a topside and an underside;
a set of topside circuit components mounted on the topside of the support plate, the circuit components constituting a transport stream generating device that generates transport stream data and transport stream control signals;
a topside connector mounted to the topside of the support plate;
an underside connector mounted to the underside of the support plate;
a first set of conductive tracks connected directly between the topside connector and the underside connector and a second set of conductive tracks connecting the topside connector to the set of topside circuit components, the underside connector and the topside connector being engageable with respective underside connectors and topside connectors of other modules, the first and second set of conductive tracks arranged to convey the transport stream data and the transport stream control signals in a stack of modules; and
wherein each of the topside and underside connectors comprises a set of pins for carrying memory access signals to enable the module to function as an external memory interface.

28. A stack of modules in a processor system, said stack comprising:

a main board having an interface connector and a set of main board components, the interface connector providing a set of pins for conveying transport stream data and transport stream control signals;

at least one module comprising:
a support plate having a topside and an underside;
a set of topside circuit components mounted on the topside of the support plate and comprising a transport stream generating device configured to generate the transport stream data and the transport stream control signals;
a topside connector mounted to the topside of the support plate;
an underside connector mounted to the underside of the support plate and connected to the interface connector of the main board;
a first set of conductive tracks connected directly between the topside connector and the underside connector and a second set of conductive tracks connecting the topside connector to the topside circuit components, the underside connector and the topside connector being engaged with respective underside connectors and topside connectors of other modules in the stack, the first and second set of conductive tracks arranged to convey the transport stream data and the transport stream control signals in the stack of modules; and
wherein each of the topside and underside connectors comprises a set of pins for carrying memory access signals to enable the module to function as an external memory interface.

* * * * *

UNITED STATES PATENT AND TRADEMARK OFFICE
CERTIFICATE OF CORRECTION

PATENT NO. : 6,864,569 B2
DATED : March 8, 2005
INVENTOR(S) : Paul Evans

It is certified that error appears in the above-identified patent and that said Letters Patent is hereby corrected as shown below:

Column 10,
Line 41, "a set or pins" should read as -- a set of pins --.
Line 58, "conductive trucks" should read as -- conductive tracks --.
Line 67, "set or topside circuit components." should read as -- set of topside circuit components. --.

Column 13,
Line 12, "a multiplexer" should read as -- a multiplexor --.

Signed and Sealed this

Twenty-fifth Day of October, 2005

JON W. DUDAS
*Director of the United States Patent and Trademark Office*